United States Patent [19]

Ishida

[11] Patent Number: 5,365,109
[45] Date of Patent: Nov. 15, 1994

[54] MIS SEMICONDUCTOR DEVICE WITH POLYSILICON GATE ELECTRODE

[75] Inventor: Mamoru Ishida, Yokohama, Japan

[73] Assignee: Ricoh Company, Ltd., Tokyo, Japan

[21] Appl. No.: 928,878

[22] Filed: Aug. 11, 1992

[30] Foreign Application Priority Data

Aug. 21, 1991 [JP] Japan .................. 3-233901
Jul. 8, 1992 [JP] Japan .................. 4-204381

[51] Int. Cl.$^5$ ............ H01L 29/06; H01L 29/78
[52] U.S. Cl. ...................... 257/754; 257/64; 257/412
[58] Field of Search ............ 257/64, 412, 607, 754

[56] References Cited

U.S. PATENT DOCUMENTS

| | | | |
|---|---|---|---|
| 4,011,105 | 3/1977 | Paivinen et al. | 257/412 |
| 4,214,918 | 7/1980 | Gat et al. | 257/412 |
| 4,332,076 | 6/1982 | Solo de Zaldivar | 257/412 |
| 4,479,831 | 10/1984 | Sandow et al. | 257/412 |
| 4,536,231 | 8/1985 | Kasten | 257/64 |
| 4,697,333 | 10/1987 | Nakahara | 257/412 |
| 4,875,944 | 10/1989 | Yoshida | 257/64 |
| 5,002,618 | 3/1991 | Kanai et al. | 257/64 |
| 5,177,578 | 1/1993 | Kakinoki et al. | 257/64 |
| 5,184,200 | 2/1993 | Yamanabe | 257/64 |

Primary Examiner—Rolf Hille
Assistant Examiner—David Ostrowski
Attorney, Agent, or Firm—Cooper & Dunham

[57] ABSTRACT

A MIS semiconductor device comprises, on a silicon wafer, a gate oxide layer, a polysilicon gate electrode comprising a gate layer of polysilicon of grain size of not less than 0.3 μm doped with boron in a doping amount of not less than $3 \times 10^{19}$ atoms/cm$^3$, and a gate insulation layer, provided with metal electrodes.

6 Claims, 3 Drawing Sheets

▲ CARRIER DENSITY
△ HOLE MOBILITY

MIS SEMICONDUCTOR DEVICE WITH POLYSILICON GATE ELECTRODE

BACKGROUND OF THE INVENTION

1. Field of the Invention

The present invention relates to a low resistive polysilicon gate electrode for MIS semiconductor devices.

2. Description of the Related Art

MOS transistors are under a practical use with a gate length of 0.8–0.5 μm for high integration and high speed operation of LSI. A trend is a further reduction in gate length.

A buried channel type transistor using an n(+)-polysilicon gate electrode of n type conduction is conventionally used as a p-channel transistor constituting a CMOS.

The further reduction in gate length requires use of surface channel transistor structure using a p(+)-polysilicon gate electrode of p type conduction to restrain punch-through.

There are two problems to be solved in the above-mentioned p(+)-polysilicon gate:

(1) Boron doping is necessary for p type conduction in a polysilicon gate layer. However, since boron has a larger diffusion coefficient than phosphorus conventionally used, the boron diffuses in the gate insulation layer constituting a MOS transistor to enter a semiconductor layer, which changes device characteristics.

(2) If a doping amount of boron is to be reduced in the polysilicon gate layer to give a solution to the above problem of (1), a resistance of gate electrode itself would increase, which is problematic in high speed operation of device.

As explained, there are contradicting demands to be met, to lower the resistance while to restrain the diffusion of boron in the boron-doped p(+)-polysilicon gate electrode.

SUMMARY OF THE INVENTION

It is an object of the present invention to provide a p(+)-polysilicon gate electrode for MIS semiconductor devices, which restrains a change in device characteristics due to diffusion of boron and which achieves a low resistance of the gate electrode itself, to provide a process for producing the gate electrode, and to provide a MIS semiconductor device provided with the gate electrode.

The present invention is based on a discovery that where a polysilicon gate layer is used as a gate electrode of MOS transistor the following advantages are enhanced as crystal grains of polysilicon become larger even in the same doping concentration in polysilicon:

(1) Increase in activation rate of doped impurities; and
(2) Increase in carrier mobility.

The object of the present invention can be achieved by the following fundamental constitution. An increase in crystal grain size of polysilicon lowers a resistance of gate electrode in a low doping concentration, and the lowered doping concentration reduces an amount of diffusing boron.

A polysilicon gate electrode, a process for producing it, and a MIS semiconductor device with the gate electrode according to the present invention are constituted as follows.

A polysilicon gate electrode for MIS semiconductor devices is formed by doping with boron in a doping amount of not more than $3 \times 10^{19}$ atoms/cm$^3$ a gate layer of polysilicon, which is enlarged in grain size not less than 0.3 μm by solid phase growth of amorphous silicon which will be referred to as a-silicon or a-Si, and has a sheet resistance of not more than 500 Ω/cm$^2$.

The polysilicon gate electrode is produced by forming a polysilicon gate layer by depositing a layer of a-silicon in the chemical deposition method and then solid-phase-crystallizing the layer, doping the gate layer with boron, and activating the boron-doped gate layer with necessity.

A MIS semiconductor device comprises, on a silicon wafer, a gate oxide layer, a polysilicon gate electrode comprising a gate layer of polysilicon of grain size of not less than 0.3 μm doped with boron in a doping amount of not less than $3 \times 10^{19}$ atoms/cm$^3$, and a gate insulation layer, provided with metal electrodes.

Preferable ranges of polysilicon crystal grain size, the doping concentration, an activation temperature, and a thickness of gate insulation layer change depending on other conditions. The crystal grain size of polysilicon must be not less than 0.3 μm, as is clear from later-described results as shown in FIG. 2. When the polysilicon of grain size of not less than 0.3 μm is used, the doping concentration is not more than $3 \times 10^{19}$ atoms/cm$^3$ and a sheet resistance is not more than 500 Ω/cm$^2$, obtaining a gate electrode without characteristic change of MOS transistor. It is preferable that the activation temperature is not more than 950° C. and that the thickness of gate insulation layer is not less than 80 angstroms.

The polysilicon having a large crystal grain size used in the present invention may be obtained for example by solid phase growth of a-Si. In the solid phase growth, a crystal grain size of polysilicon may be controlled by properly selecting conditions such as a deposition condition of a-Si, and, a time and a temperature of solid phase growth.

An average grain size in the present invention is a value obtained by transmission electron microscope (TEM).

Further objects and advantages of the present invention will be apparent from the following description of the preferred embodiments of the invention as illustrated in the accompanying drawings.

DESCRIPTION OF THE PREFERRED EMBODIMENTS

EXAMPLE 1

Figure 1:
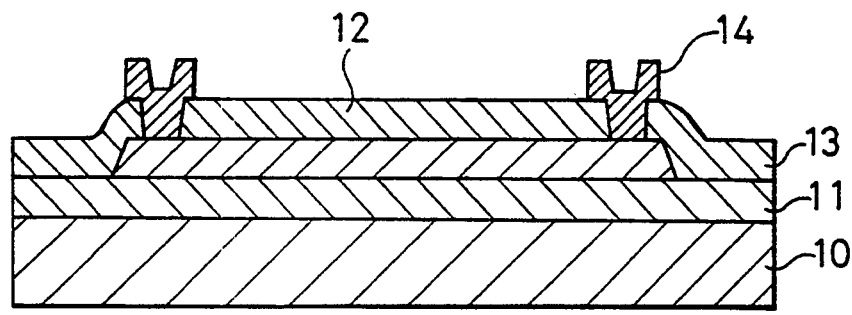
FIG. 1 is a sectional view to show an embodiment of MIS semiconductor device with a polysilicon gate electrode according to the present invention.

Samples of MIS semiconductor device with a polysilicon gate electrode were prepared in a structure as shown in FIG. 1 while changing a crystal grain size of polysilicon and a boron doping concentration.

A gate oxide layer 11 was formed on a surface of silicon wafer 10. A polysilicon gate layer 12 was made on the gate oxide layer 11 for each of samples A, B, C different in crystal grain size. After that, B(+) ions were implanted in the gate layer 12 in a dose of $1\times10^{15}$ ions/cm$^2$ or of $5\times10^{15}$ ions/cm$^2$ with implantation energy of 15 keV. After the implantation, the samples were activated by annealing at 950° C. for thirty minutes. Then a gate insulation layer 13 and metal electrodes 14 were formed to conclude the preparation of samples.

The polysilicon gate layers of the samples A-C were prepared as follows.

Sample A: Polysilicon by LP-CVD method (630° C., SiH$_4$ gas source);

Sample B: Polysilicon by solid phase crystallization (600° C., 20 hours) of a-Si obtained by LP-CVD method (540° C., SiH$_4$ gas source); and Sample C: Polysilicon by solid phase crystallization (600° C., 20 hours) of a-Si obtained by LP-CVD method (500° C., Si$_2$H$_6$) gas source.

Average crystal grain sizes of the Samples are listed in a Table to follow.

TABLE

| Sample | Average crystal grain size |
|---|---|
| A | 0.05 μm |
| B | 0.3 μm |
| C | 0.6 μm |

Thicknesses of polysilicon gate layers were between 0.10 and 0.11 μm.

Figure 2:
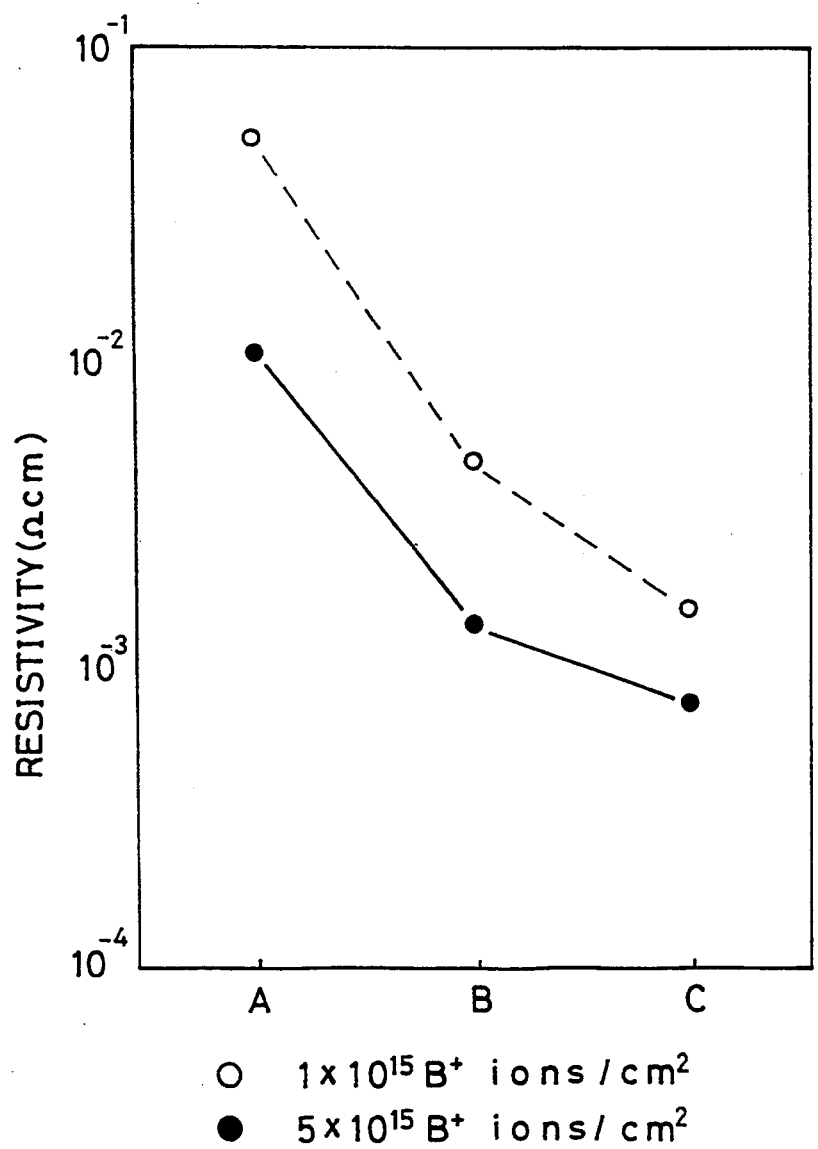
FIG. 2 is a drawing to show a relation between a dose of boron and a resistivity of polysilicon gate electrode in each of samples A, B, and C.

FIG. 2 shows a relation between a boron dose and a resistivity of polysilicon gate electrode in each of the samples A, B, C.

As seen in FIG. 2, a larger crystal grain size has a considerably lowered resistivity of gate electrode.

It is also clear that the resistance of the gate electrode itself may be lowered by use of polysilicon larger in grain size even in a low doping amount.

Figure 3:
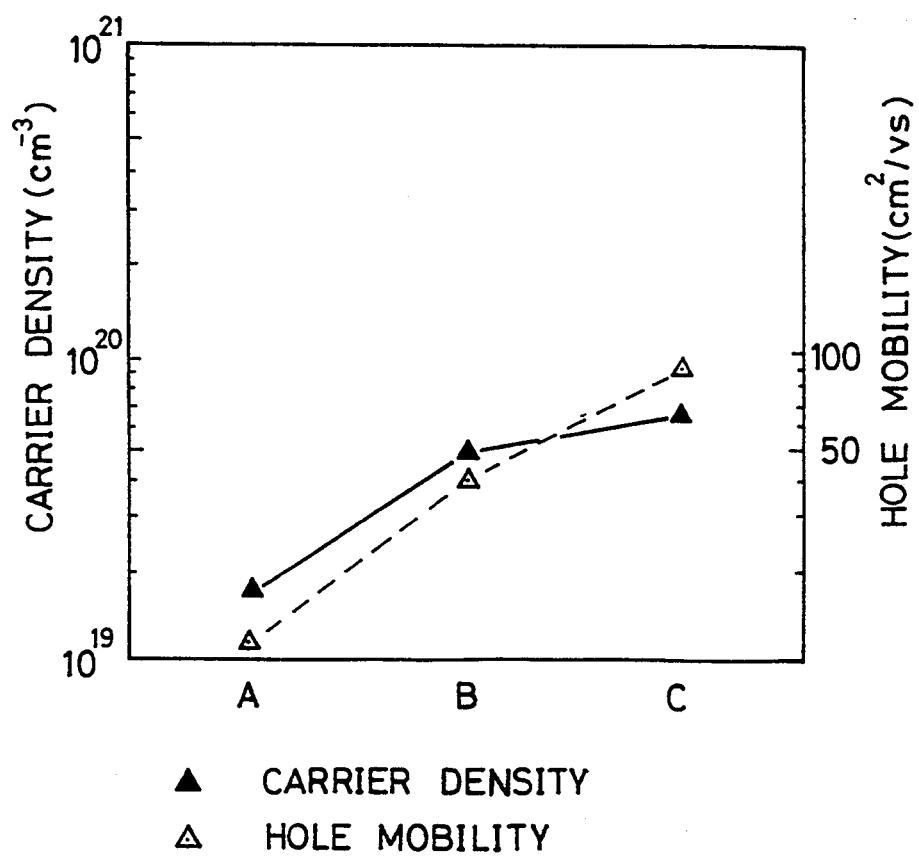
FIG. 3 is a drawing to show a carrier density and a hole mobility in a Hall effect for each of samples A, B, and C with a boron dose of $1 \times 10^{15}$ ions/cm$^2$.

FIG. 3 shows a carrier density and a hole mobility obtained using the Hall effect in each of the three samples in a dose of $1\times10^{15}$ ions/cm$^2$.

As the grain size increases, both the carrier density and the hole mobility become greater. This shows that the carrier density and the hole mobility contribute to the lowering of resistance of the gate electrode itself.

EXAMPLE 2

The similar samples were prepared as in Example 1. Relations of a sheet resistance of the polysilicon gate electrode and a flat-band voltage ($V_{FB}$) of MOS capacitor were respectively measured to a boron dose for each of the samples.

A gate oxide layer 11 of 100 angstroms was formed on a surface of silicon wafer 10 of p type in a doping amount of $1\times10^{15}$ atoms/cm$^3$. A polysilicon gate layer 12 was formed on the gate oxide layer 11 for each of samples A, B different in crystal grain size as listed in above Table. Then BF$_2$(+) ions were implanted into the gate layer 12 with implantation energy of 20 keV in a dose of $5\times10^{14}$ to $5\times10^{15}$ ions/cm$^2$. The dose of $1\times10^{15}$ ions/cm$^2$ corresponds to a doping concentration of $3\times10^{19}$ atoms/cm$^3$, taking into consideration a thickness of the polysilicon gate layer.

Figure 4:
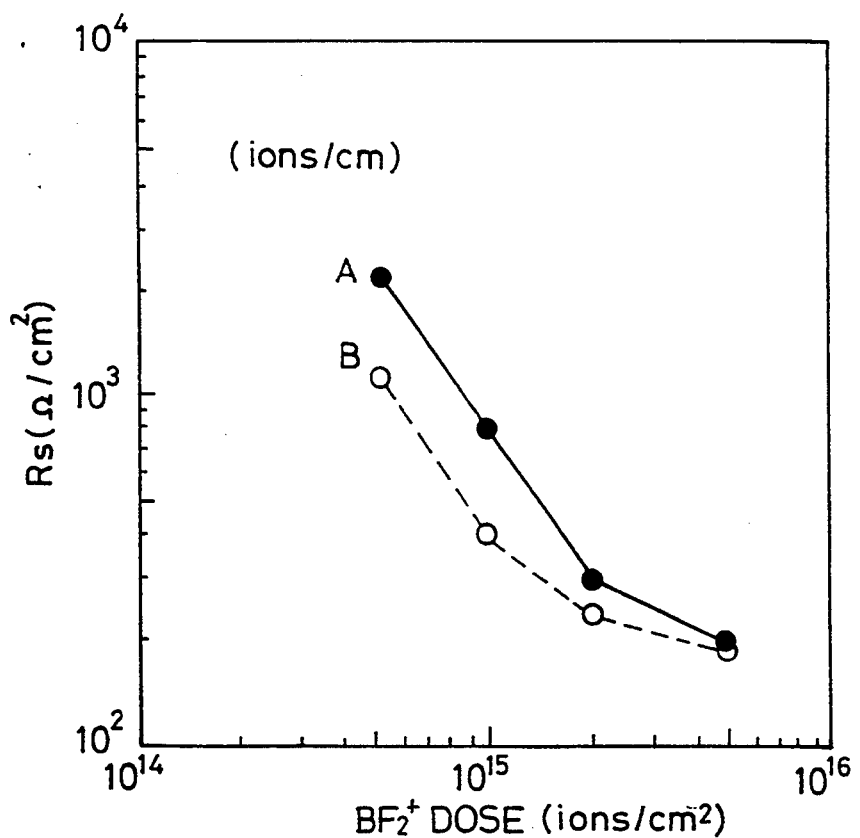
FIG. 4 is a drawing to show a relation between a boron dose and a sheet resistance of p(+)-polysilicon gate electrode.
Figure 5:
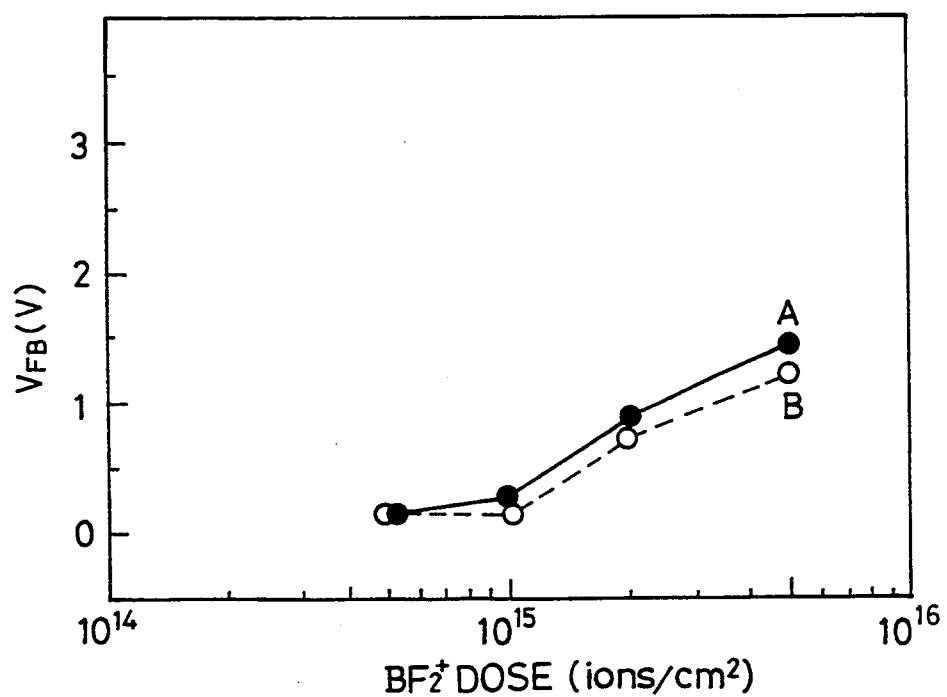
FIG. 5 is a drawing to show a relation between a boron dose and a flat-band voltage $V_{FB}$ of a MOS capacitor.

After the implantation, a gate insulation layer 13 was formed. Then the samples were activated at 850° C. for thirty minutes. Then metal electrodes 14 were formed to concludes the preparation of samples. FIGS. 4 and 5 show a relation between a boron dose and a sheet resistance of gate electrode, and a relation between a boron dose and a flat-band voltage for each of the samples A, B.

From the results as shown in FIGS. 4 and 5, it can be seen that the sample B larger in crystal grain size has a lower sheet resistance of gate electrode and a smaller change in $V_{FB}$.

In the present invention, increasing the crystal grain size of polysilicon constituting the gate electrode leads to lowering the resistance of gate electrode even in a low doping concentration and to restricting a change of device characteristics due to the diffusion of boron.

Many widely different embodiments of the present invention may be constructed without departing from the spirit and scope of the present invention. It should be understood that the present invention is not limited to the specific embodiments described in the specification, except as defined in the appended claims.

What is claimed is:

1. A polysilicon gate electrode for MIS semiconductor devices obtained by doping boron in a gate layer of polysilicon, wherein a crystal grain size of said polysilicon is at least 0.3 μm, the polysilicon gate layer contains the boron in a doping amount of not more than $3\times10^{19}$ atoms/cm$^3$ and a sheet resistance of the gate electrode is not more than 500 Ω/cm$^2$.

2. A MIS semiconductor device in which a gate oxide layer, a polysilicon gate electrode comprising a gate layer of polysilicon of grain size of at least 0.3 μm doped with boron, and a gate insulation layer, provided with metal electrodes, are formed on a surface of a silicon wafer, wherein the polysilicon gate electrode comprising the gate layer of polysilicon containing the boron in a doping amount of not more than $3\times10^{19}$ atoms/cm$^3$ and a sheet resistance of the gate electrode is not more than 500 Ω/cm$^2$.

3. A polysilicon gate electrode according to claim 1, wherein said polysilicon has the crystal grain size enlarged not less than 0.3 μm by solid phase growth of amorphous silicon.

4. A MIS semiconductor device according to claim 2, in which a thickness of said gate insulation layer is at least 80 angstroms.

5. A MIS semiconductor device according to claim 2, in which said polysilicon has the crystal grain size enlarged not less than 0.3 μm by solid phase growth of amorphous silicon.

6. A MIS semiconductor device according to claim 5, wherein the polysilicon gate electrode comprising the gate layer of polysilicon containing the boron in a doping amount of not more than $3\times10^{19}$ atoms/cm$^3$ and a sheet resistance of the gate electrode is not more than 500 Ω/cm$^2$.

* * * * *

UNITED STATES PATENT AND TRADEMARK OFFICE
CERTIFICATE OF CORRECTION

PATENT NO. : 5,365,109
DATED : November 15, 1994
INVENTOR(S) : Mamoru ISHIDA It is certified that error appears in the above-identified patent and that said Letters Patent is hereby corrected as shown below:

Title page, right-hand column, section [57], Abstract lines 4 and 5, change "a doping amount of not less than" to --a doping amount of not more than--

Signed and Sealed this

Fifth Day of November, 1996

Attest:

BRUCE LEHMAN

*Attesting Officer*       *Commissioner of Patents and Trademarks*